United States Patent [19]
Adams et al.

[11] Patent Number: 5,404,142
[45] Date of Patent: Apr. 4, 1995

[54] DATA-DIRECTED SCRAMBLER FOR MULTI-BIT NOISE SHAPING D/A CONVERTERS

[75] Inventors: Robert W. Adams, Acton, Mass.; Tom W. Kwan, Santa Clara, Calif.

[73] Assignee: Analog Devices, Incorporated, Norwood, Mass.

[21] Appl. No.: 102,574

[22] Filed: Aug. 5, 1993

[51] Int. Cl.$^6$ .................. H03M 1/66; H03M 1/06
[52] U.S. Cl. ..................... 341/144; 341/118
[58] Field of Search ............ 341/118, 120, 141, 143, 341/144, 150, 153, 154

[56] References Cited

U.S. PATENT DOCUMENTS

| | | | |
|---|---|---|---|
| 4,703,310 | 10/1987 | van de Plassche | 341/144 |
| 4,791,406 | 12/1988 | Mehrgardt et al. | 341/144 |
| 4,851,841 | 7/1989 | Sooch | 341/143 |
| 5,128,317 | 8/1992 | Story | 341/144 |
| 5,221,926 | 6/1993 | Jackson | 341/118 |
| 5,305,004 | 4/1994 | Fattaruso | 341/120 |

OTHER PUBLICATIONS

L. R. Carley, "A Noise-Shaping Coder Topology for 15+ Bit Converters", IEEE J. Solid-State Circuits, vol. SC-24, pp. 267–273, Apr. 1989.

B. H. Leung et al "Multibit Sigma-Delta A/D Converter Incorporating A Novel Class of Dynamic Element Matching Techniques", IEEE Transactions on Circuits and Systems-II: Analog and Digital Signal Processing vol. 39, No. 1, Jan. 1992, pp. 35–51.

A. V. Oppenheim et al, "Digital Signal Processing", Prentice-Hall, 1975, pp. 302–309.

*Primary Examiner*—Howard L. Williams
*Attorney, Agent, or Firm*—Parmelee, Bollinger & Bramblett

[57] ABSTRACT

A scrambler for use with thermometer-code digital signals and having a number of interconnected identical switching cells in the form of swapper cells with two inputs and two outputs. A control signal determines whether the inputs are connected directly or reversely to the outputs. The control signal is developed by logic circuitry which receives as inputs the two swapper cell input bits and a state bit representing the integrated difference of past swapper output signals.

12 Claims, 9 Drawing Sheets

DATA-DIRECTED SCRAMBLER FOR MULTI-BIT NOISE SHAPING D/A CONVERTERS

BACKGROUND OF THE INVENTION

1. Field of the Invention

This invention relates to D/A converters of the sigma-delta noise-shaping type. More particularly, this invention relates to multi-bit noise-shapers, i.e., where the quantizer truncates the digital word to more than 1-bit.

2. Description of the Prior Art

Figure 1:
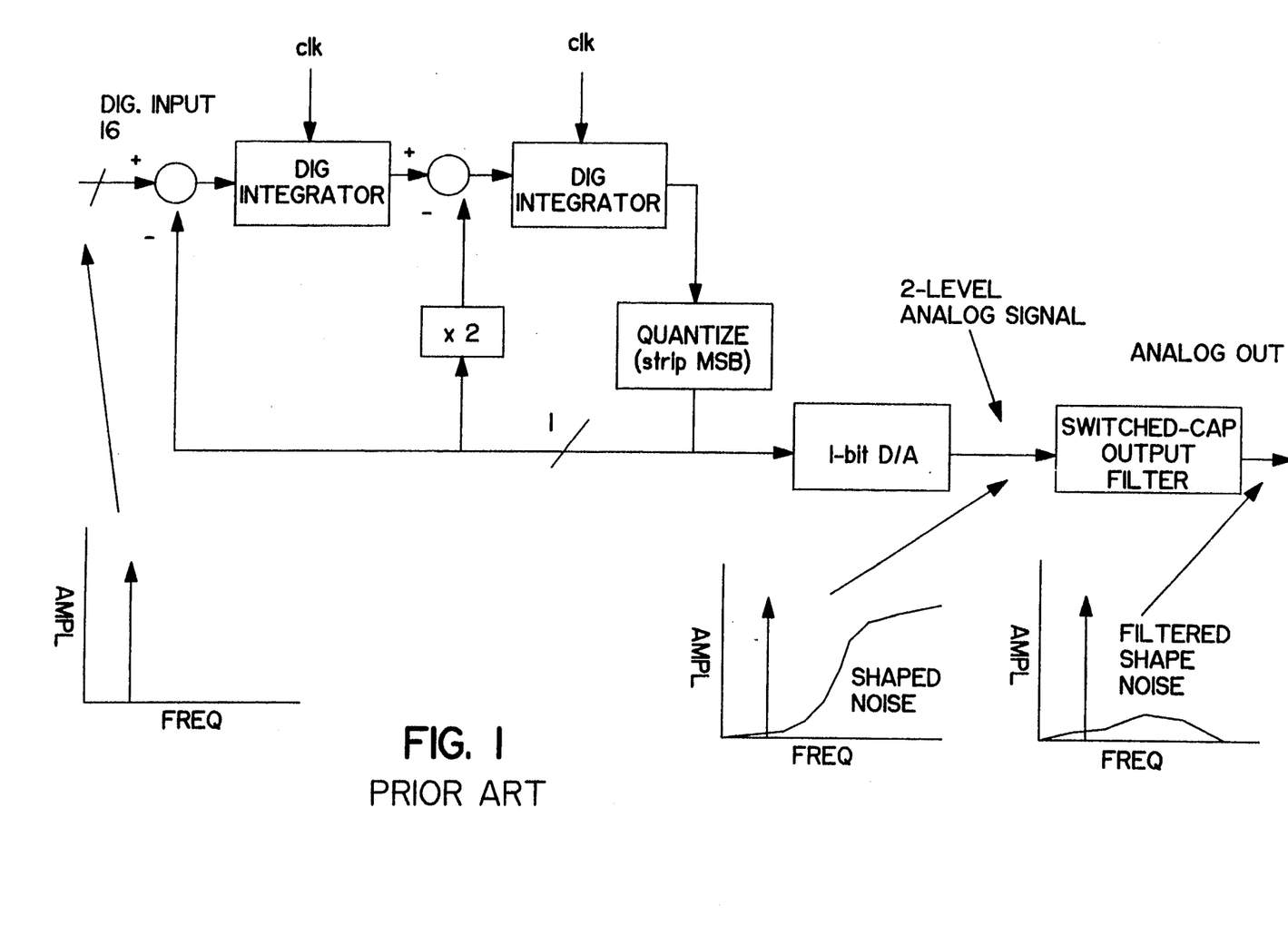
FIG. 1 is a block diagram illustrating a one-bit noise-shaping D/A converter with a switched capacitor output filter.

One of the problems with noise-shaping D/A converters is that of removing the large amount of out-of-band noise produced by the digital modulator. One approach to solving this problem is to use switched-capacitor low-pass filters, as illustrated in FIG. 1. Such filters are however relatively expensive in silicon area, and often exhibit non-ideal behavior such as increased noise and distortion products.

Figure 2:
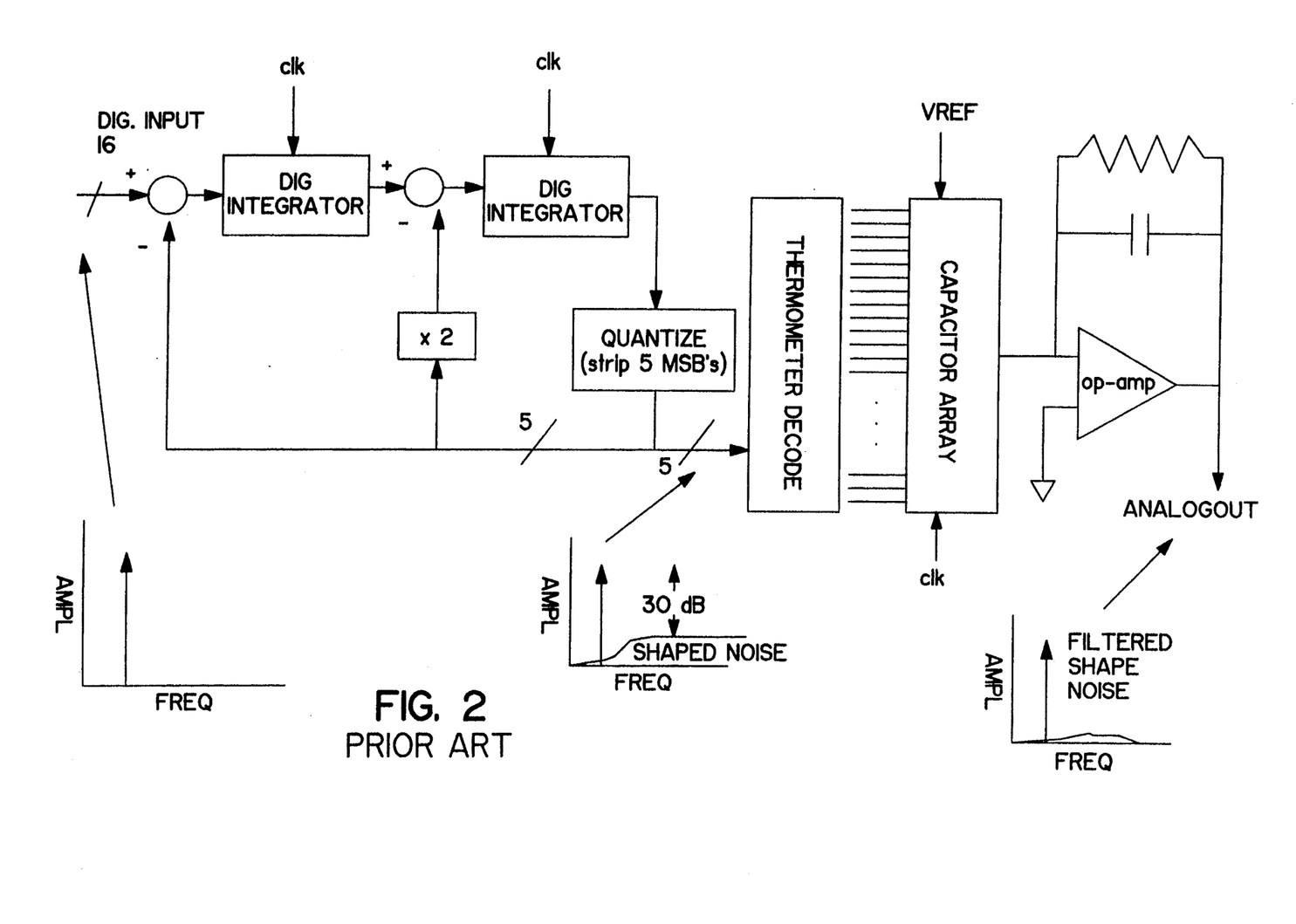
FIG. 2 is a block diagram illustrating a multi-bit noise-shaping converter with a thermometer-code output.

Another approach to solving this problem is to use a multi-bit noise-shaper, where the quantizer truncates the digital word to more than 1 bit. Such a system is illustrated in FIG. 2. By using multiple levels and arranging the loop such that the idle-channel limit-cycle noise only spans a few quantization levels, it is possible to reduce the out-of-band noise significantly compared to the 1-bit case. For example, a loop employing a 5-bit quantizer should allow for reduction of out-of-band noise by roughly a factor of 30:1.

The reason this latter approach has not commonly been used is that errors in the digital-to-analog converter used to turn the multi-bit digital signal into an analog voltage will cause linearity errors in the analog output. This is quite different from the single-bit case, where perfect linearity is guaranteed by virtue of the fact that only two levels exist at the analog output.

Proposals have been made of ways to use "scrambling" techniques to minimize the linearity problem with multi-bit noise-shapers. Examples include an article by L. Richard Carley titled "A Noise-Shaping Coder Topology for 15+ Bit Converters" IEEE J Solid-State Circuits, Vol. SC-24, pp. 267–273, April 1989, and an article by Bosco H. Leung et al titled "Multibit Sigma-Delta A/D Converter Incorporating A Novel Class of Dynamic Element Matching Techniques", IEEE Transactions on Circuits and Systems—II: Analog and Digital Signal Processing, Vol. 39, No. 1, January 1992.

All of such "scrambling" arrangements require that the multi-bit output of the noise shaper first be converted to a "thermometer code". This is a code where all of the bits are equally weighted. For example, a 5-bit binary code converted to a thermometer code would require 31 equally-weighted bits (the "all bits off" state does not require an output bit). If the input number was "11", then the thermometer code would have the bottom 11 bits set to a "1" and the top 20 bits set to "0".

In a thermometer code, it is only the number of "on" bits during a clock period that is important. This fact forms the basis for all of the scrambling algorithms described in this application. Conceptually, scrambling works by dynamically assigning a bit at the scrambler output to one of the input bits, and changing this assignment on a dynamic basis (normally every clock cycle).

It will be evident that these input bit-to-output bit assignments must be mutually exclusive. That is, each input bit may be connected to one and only one output bit. Random scrambling would choose a random configuration of the scrambler on each clock cycle and could be accomplished in hardware by having a $2^N$ input multiplexer for every output line, where N is the number of binary bits at the input to the thermometer decoder. In this way, every output could independently select an input source, as long as the input source was not already used. However, since this technique requires $2^N$ switches per output line, it is not practical when N is large.

If a thermometer-decoder output is fed to a DAC consisting of $2^N$ nominally equally-weighted branches that sum into a summing junction, there will always be some error due to analog matching constraints that cause the weights to be slightly in error. Without any scrambling, this error would result in harmonic distortion, as every particular thermometer-decoded bit is active only during a particular range of input codes to the noise-shaper. With scrambling, there is no longer any correlation between a particular bit coming out of the scrambler and a particular range of input values to the noise-shaper. This causes the error introduced by bit-weight errors in the DAC to be de-correlated from the signal, and hence the effect of a bit-weight error is to cause increased broadband white noise instead of distortion.

Figure 3:
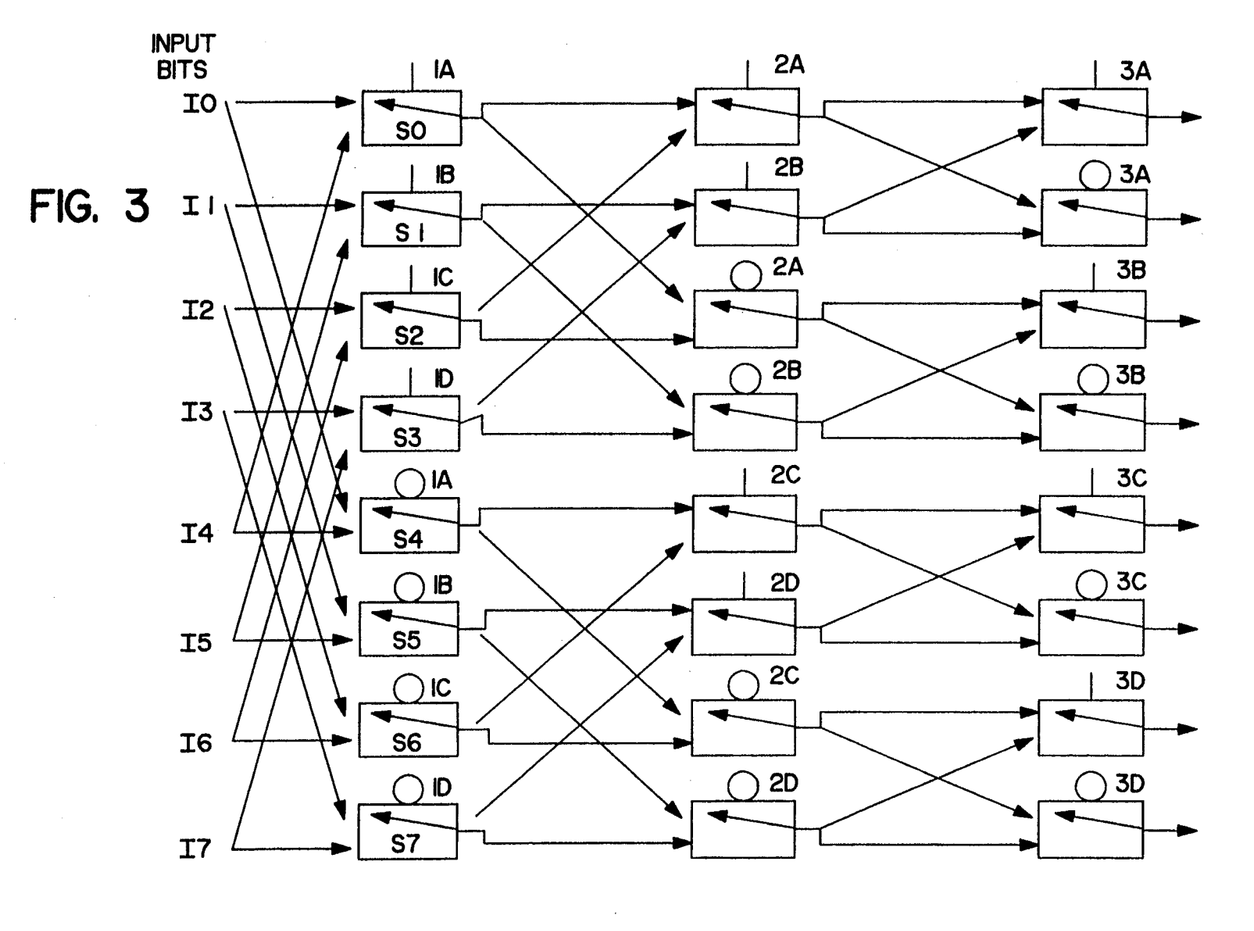
FIG. 3 presents a diagram illustrating a Butterfly scrambling algorithm.

The Carley article, referred to above, proposes a scrambler that is based on a fast-fourier-transform-like "Butterfly". This algorithm is carried out by the switch arrangement shown in FIG. 3, illustrated for use with an 8-bit input. The switches in each column work in pairs. For example, the first column in FIG. 3 contains two switches (S0 and S4) that are controlled by logic signal "1A". These two switches use opposite polarities of the control signal 1A as indicated by the logic inversion bubble on one of the two switches.

This Butterfly topology does not allow all possible configurations of input to output mappings, but only a limited subset. However, every input line can connect to every output line, and the number of switches need only be K.N (where $K=2^N$ and N=number of binary bits at the input to the thermometer decoder) instead of $K^2$ as before.

Figure 4:
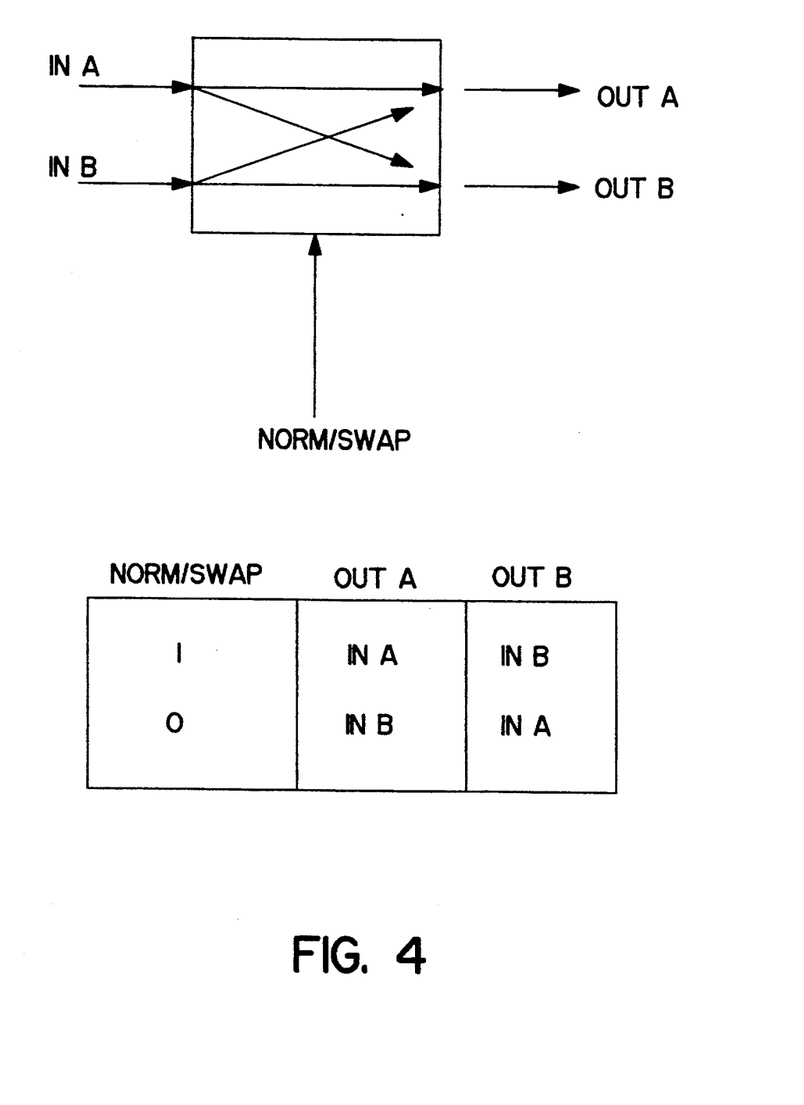
FIG. 4 shows a swapper cell in block format.
Figure 5:
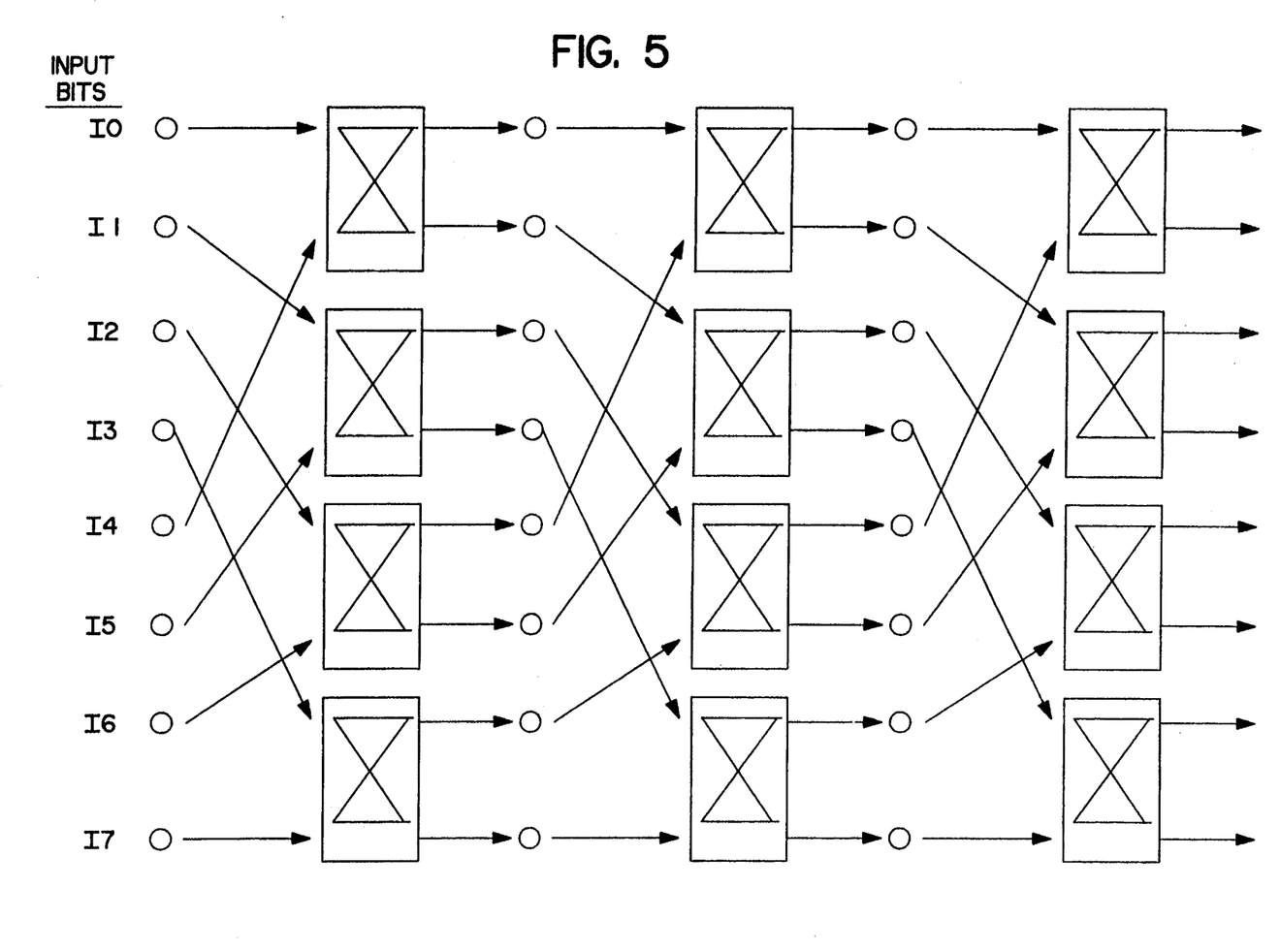
FIG. 5 presents diagrammatically a scrambler formed of three sets of interconnected swapper cells.

Since switch "S0" and switch "S4" are both connected to the same two inputs (input I0 and input I4), it will be seen that these two switches operate as a "swapper", as illustrated in block format in FIG. 4. This block will either pass its two inputs directly through to the outputs, when the control signal (Norm/Swap) is low, or "swap" them when the control signal goes high so as to connect the inputs to the outputs reversely. Accordingly, the Butterfly scrambling algorithm can be redrawn with all groups of switches that receive the same two inputs shown as "swapper" cells, as shown in FIG. 5. For this algorithm each swapper cell would receive a random logic signal (high or low) on each clock cycle. It may be noted that in FIG. 5, the order of the switches in each column has been altered to provide that the interconnection between stages is the same for each stage. Such modification of the flow graph also has been made for FFT structures, as described by A. V. Oppenheim et al, in "Digital Signal Processing", Prentice-Hall, 1975, pg 309.

The increase in white noise floor power resulting from random scrambling may be acceptable for low-performance designs, but to achieve very high performance (for example, greater than 100 dB) still requires very high accuracy in the DAC thermometer weights. To overcome this problem, a solution has been proposed by Leung et al (see above) called "individual level averaging", which results in the output spectrum of each bit at the scrambler output being noise-shaped. This noise-shaping causes the error produced by a non-ideal DAC weight to occur only at high frequencies that are above the band of interest. This allows larger errors to occur in the DAC without increasing the in-band noise penalty.

This approach is based on a rotation-type scrambler where a barrel shifter is used as the scrambling block. For an N-bit input with $K=2^N$ thermometer-decode inputs to the scrambler, there are K unique rotations possible. Such a barrel shifter preserves the number of "1's" at the output.

For each of the possible $K=2^N$ thermometer-decoded scrambler input patterns (where N is the number of bits in the loop quantizer), a memory stores the state of the barrel shifter that was used to map input bits into output bits. Whenever a particular input code is presented to the barrel shifter, the "memory" for that particular input code is examined, and a barrel-shift control word is selected which has not been used yet in the sequence. For example, in the 3-bit case, there are 8 possible input codes and 8 possible barrel-shift positions. For each input code there is a memory that is 7 locations deep. All 7 locations are examined for a particular input code, and whichever barrel-shift code is not found in the memory is used for the current shift control word. This word is then entered in the memory for that particular input code.

This technique guarantees that over a long time period there is no DC error for every possible input code, as all possible barrel-shift locations are used for that input code in the shortest possible time. However, the amount of time taken for this sequence to complete for a given code is data-dependent because it depends on the frequency of occurrence of that particular input code. It is quite possible to get very long repeat times, especially for noise shapers with a high number of quantization levels. This tends to produce lower-frequency noise, and reduces the benefit of this technique in comparison to random averaging using the Butterfly scrambler described above. A serious drawback is that the spectrum of each individual bit output may contain low-frequency noise that degrades the passband signal-to-noise ratio.

SUMMARY OF THE INVENTION

In a preferred embodiment of the invention, to be described hereinafter in detail, there is provided a scrambler arrangement similar in architecture to prior art arrangements and comprising a plurality of identical switching cells, referred to as swapper cells, with each having two input terminals and two output terminals. An activating signal controls the internal cell switches to connect the input terminals to the output terminals either directly or to connect them reversely, such that the input signals are "swapped" as they pass through the cell. In the described embodiment, there are three sets of swapper cells, one set of which receives the input signal as a number of bits of a thermometer code. The output bits of that set are connected as inputs to the second set, and the outputs of the latter set are connected as inputs to the third set which produces the final scrambled output. In such a circuit configuration, more than 3 sets will be required for $N>3$ ($K>8$). For example, 5 sets are required for $K=32$ ($N=5$).

In accordance with an important aspect of the invention, the activating signal for each cell is controlled to either high or low ("swap" or "no swap") by logic circuitry which responds to the states of the cell input signal bits and the state of a difference signal developed as the integrated difference of prior swapper output signals. The functioning of the scrambler thus is controlled by the actual received data. This has the effect of shifting the noise due to an error in weighting to higher frequencies, out of the passband.

Other objects, advantages and aspects of the invention will in part be pointed out in, and in part apparent from, the following detailed description considered together with the accompanying drawings.

DETAILED DESCRIPTION OF PREFERRED EMBODIMENT

The preferred embodiment of the present invention is based on the scrambler architecture employed to carry out the FFT-like "Butterfly" algorithm shown in FIG. 5 and discussed above. That prior art architecture makes use of a number of "swapper" cells which are activated to "swap" or "no swap" condition by random logic control signals (high or low) on each clock signal. In the inventive embodiment described herein, however, the activating control signal is derived by performing logical operations on (1) the incoming data signals to the swapper cell, and (2) a signal developed as the integrated difference of past output signals of the swapper cell.

Figure 6:
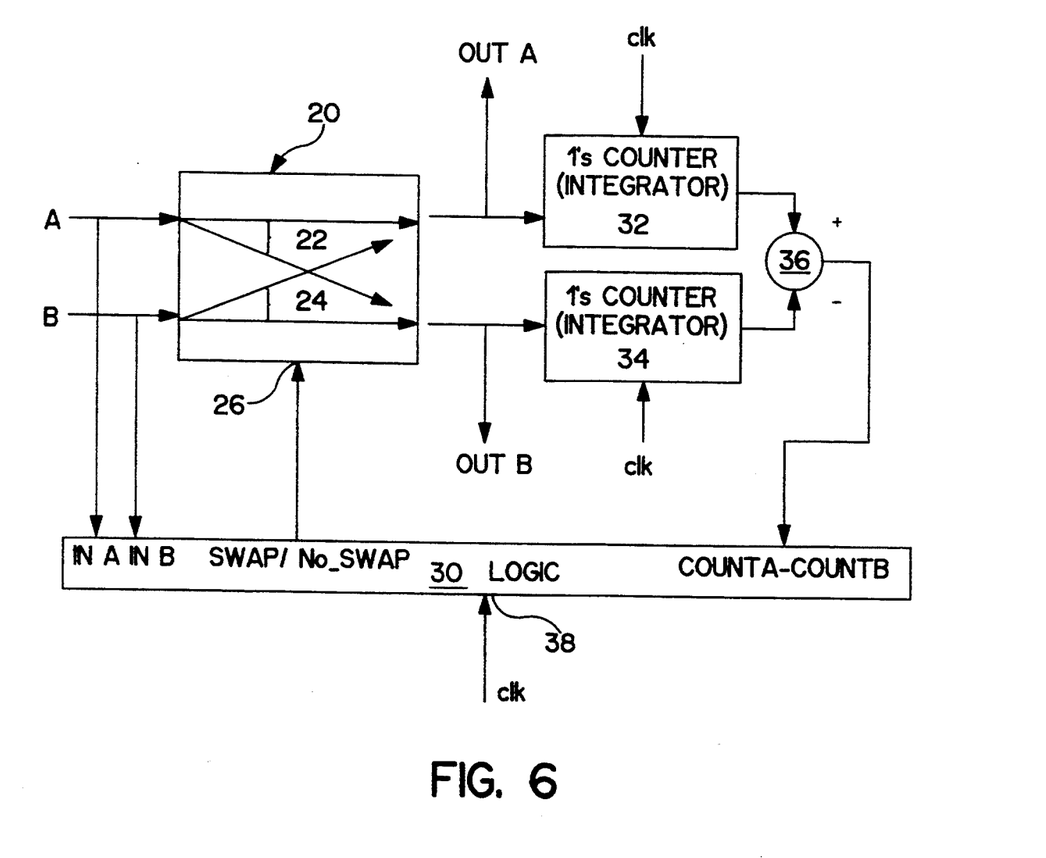
FIG. 6 shows a swapper cell controlled by data-directed logic.

This new swapper cell arrangement is illustrated in block format in FIG. 6. The swapper cell is identified at 20, and includes the usual complementary switch pair, not shown in detail but shown diagrammatically at 22 and 24. In such switch configuration, the upper input signal (IN A) is connectible by switch 22 to either the upper output terminal (OUT A) or the lower output terminal (OUT B). The other switch 24 operates simultaneously to connect the lower input signal (IN B) to (1) the lower output terminal (OUT B) or (2) the upper output terminal (OUT A). Thus, the input signals A, B are connected either directly to the corresponding output terminals A and B (upper input to upper output and lower input to lower output), or reversely to those output terminals, in accordance with the state (low or high) of the control signal applied at the activating signal terminal 26.

The state of this activating control signal is determined by the operation of logic circuitry shown in block format at 30. This logic circuitry receives the two input signals A and B and also a signal developed as the integrated difference between past swapper cell output signals. To this end, the swapper cell output terminals OUT A and OUT B may in one apparatus configuration be connected to respective 1's counters functioning as integrators 32 and 34. These counters increment each time a "1" occurs at their input at the clock time.

The integrator outputs are directed to a differencing circuit 36 which produces and stores a signal representing the difference between the integrator outputs (COUNT A−COUNT B). This signal is applied to the logic circuitry 30 which performs a logical operation for each clock pulse at terminal 38, and produces a corresponding "swap, no-swap" signal for the control signal terminal 26 of the swapper cell.

The logic circuitry 30 operates on these applied signals (IN A, IN B and COUNT A−COUNT B) in the manner described in the truth table set forth below:

2-State Truth Table

| INA | INB | CNTA−CNTB | SWAP CTRL | NEW CNTA−CNTB |
|---|---|---|---|---|
| 0 | 0 | 0 | X | 0 |
| 0 | 0 | 1 | X | 1 |
| 0 | 1 | 0 | SWAP | 1 |
| 0 | 1 | 1 | NO SWAP | 0 |
| 1 | 0 | 0 | NO SWAP | 1 |
| 1 | 0 | 1 | SWAP | 0 |
| 1 | 1 | 0 | X | 0 |
| 1 | 1 | 1 | X | 1 |

In the above table, the first two columns are the input signals IN A and IN B; the third column is the difference signal "COUNT A-COUNT B". The fourth column gives the state of the swap control signal. It may be noted that when the inputs are the same, the state of the swap control signal is not specified; that is, it can be either high or low ("don't care") and is shown as "X". When the inputs are not the same, the difference signal will be changed from its current state, i.e., from "0" to "1", or from "1" to "0".

The logic circuitry 30 causes the "new CNTA-CNTB" difference signal to always be either a "0" or a "1", so that the "CNTA-CNTB" result can be stored in only one bit. The hardware realization of this circuitry therefore only requires one bit of "state". A simple combinational logic circuit that receives the current two input bits and the "CNTA-CNTB" state bit can issue the "swap/no swap" signal as well as update the state of the "CNTA-CNTB" difference signal. Accordingly, it is not necessary to actually have integrating counters such as illustrated at 32 and 34. The difference signal is constrained to shift only between 0 and 1, so the integral always is bounded by being kept close to zero. Thus there will be no net d-c component developed in the output signal.

Figure 7:
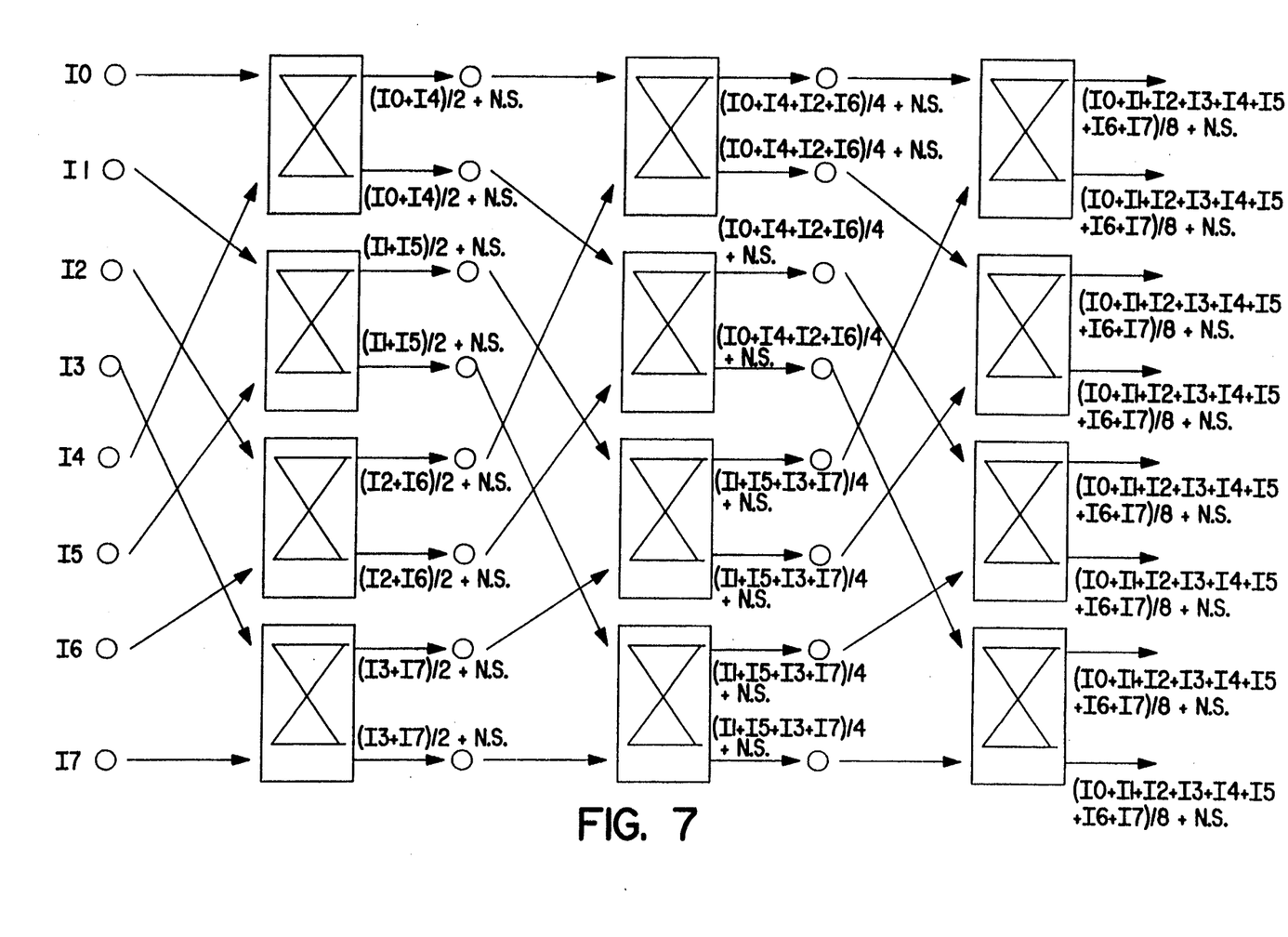
FIG. 7 shows the scrambler of FIG. 5 rearranged and with output signal legends.

It can be shown that this scrambling technique results in "noise-shaping" of each individual swapper output bit. Thus, if a number of such data-directed swapper cells are arranged in interconnected format, for example for an 8-bit thermometer code input as shown in FIG. 7, the outputs from each swapper cell will, as indicated by the legends on the drawing, represent an average of the input signals received by that swapper cell, plus a noise-shaping error term (identified as N.S.).

In a multi-bit sigma-delta loop, the sum of all the thermometer-decoded output bits will represent the total input signal plus a noise-shaping term. Therefore, the following can be said of the scrambler shown in FIG. 7:

(1) The sum of all of the scrambled output bits (assuming no errors) is equal to the noise-shaping input plus an Nth-order noise-shaping term, where N is the order of the digital shaper. (N=2 in the noise shaper of FIG. 2.)

(2) Each individual output bit represents the average (sum) of all of the thermometer-decoded output bits from the noise-shaper, plus a first-order noise-shaping term. This term contains two sources of shaped noise, one from the digital noise-shaper itself, and the other from the data-directed scrambling operation.

An advantage of using this approach is that if a particular output weight is incorrect, most of the error will occur at higher frequencies, and very little of the error will occur in the band of interest. Since each bit represents the input plus two noise-shaping terms, an error in the output weight will cause no harmonic distortion.

Figure 8:
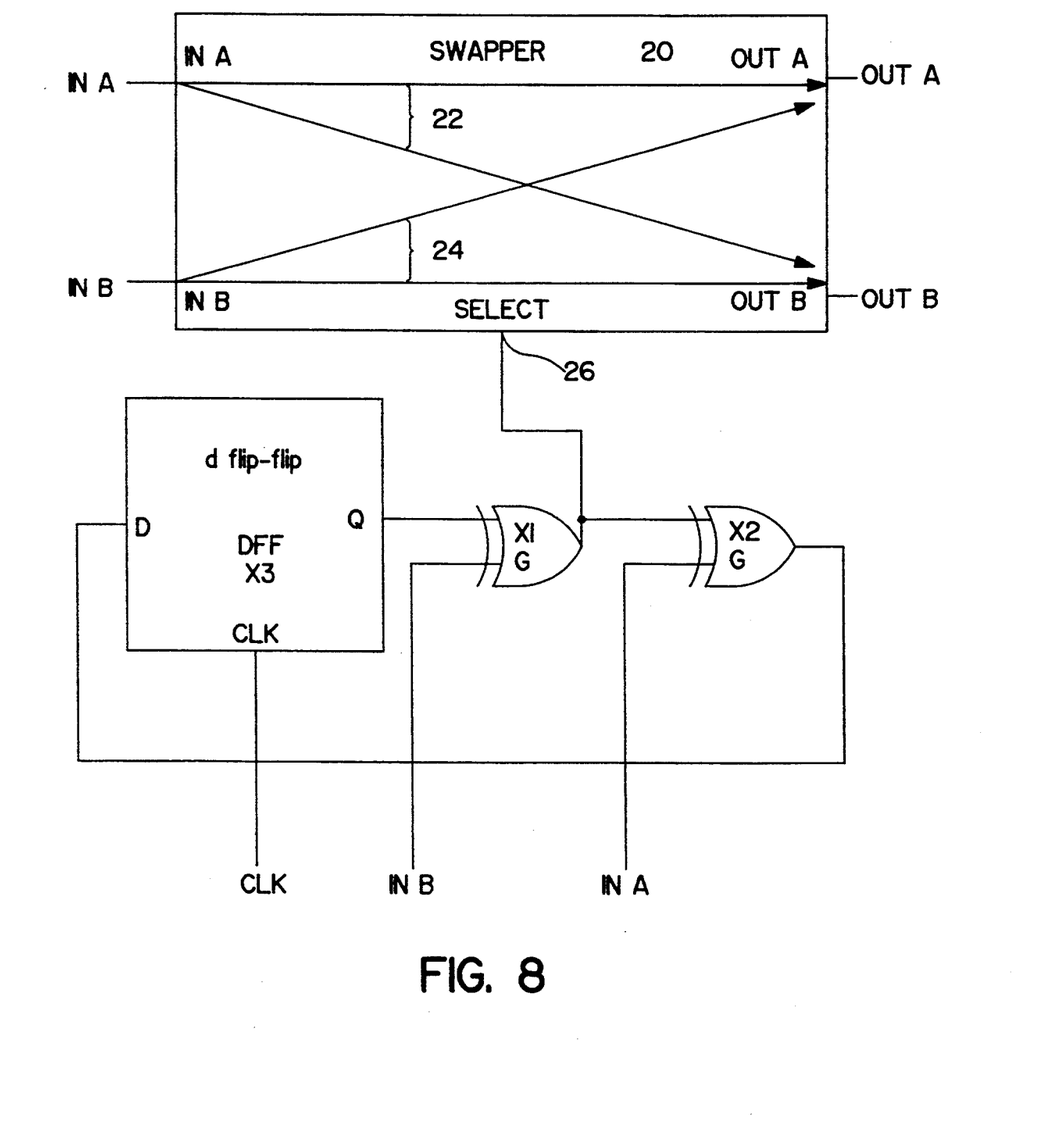
FIG. 8 is a diagrammatic showing of a data-directed swapper cell.

Various hardware arrangements can be used for carrying out the logical operations associated with the data-directed scrambler cell described above. Logic synthesis may be employed for converting the truth table to appropriate logic elements. A design resulting from such synthesis is shown in FIG. 8. This design requires only two XOR gates (X1, X2) and a single clocked D-flip/flop (DFF) which holds the difference signal "state" information. The XOR gates provide the logic to produce the next "state" bit, as well as the swap/no swap signal at the control signal "select" terminal 26 of the swapper cell.

It will be seen that the hardware for carrying out the logic specified by the above truth table need not include the dedicated integrating counters 32 and 34 shown in FIG. 6, nor is there any need to provide a connection from the swapper output back to the logic circuitry. This is because the difference between the two swapper outputs is known by only knowing the state of the inputs and the state of the swap/no swap signal. That is, the operation carried out by the logic circuitry of FIG. 8 produces the same results as the configuration shown in FIG. 6, with the flip/flop DFF storing a state signal (0 or 1) which represents the integrated difference of past swapper output signals.

Figure 9:
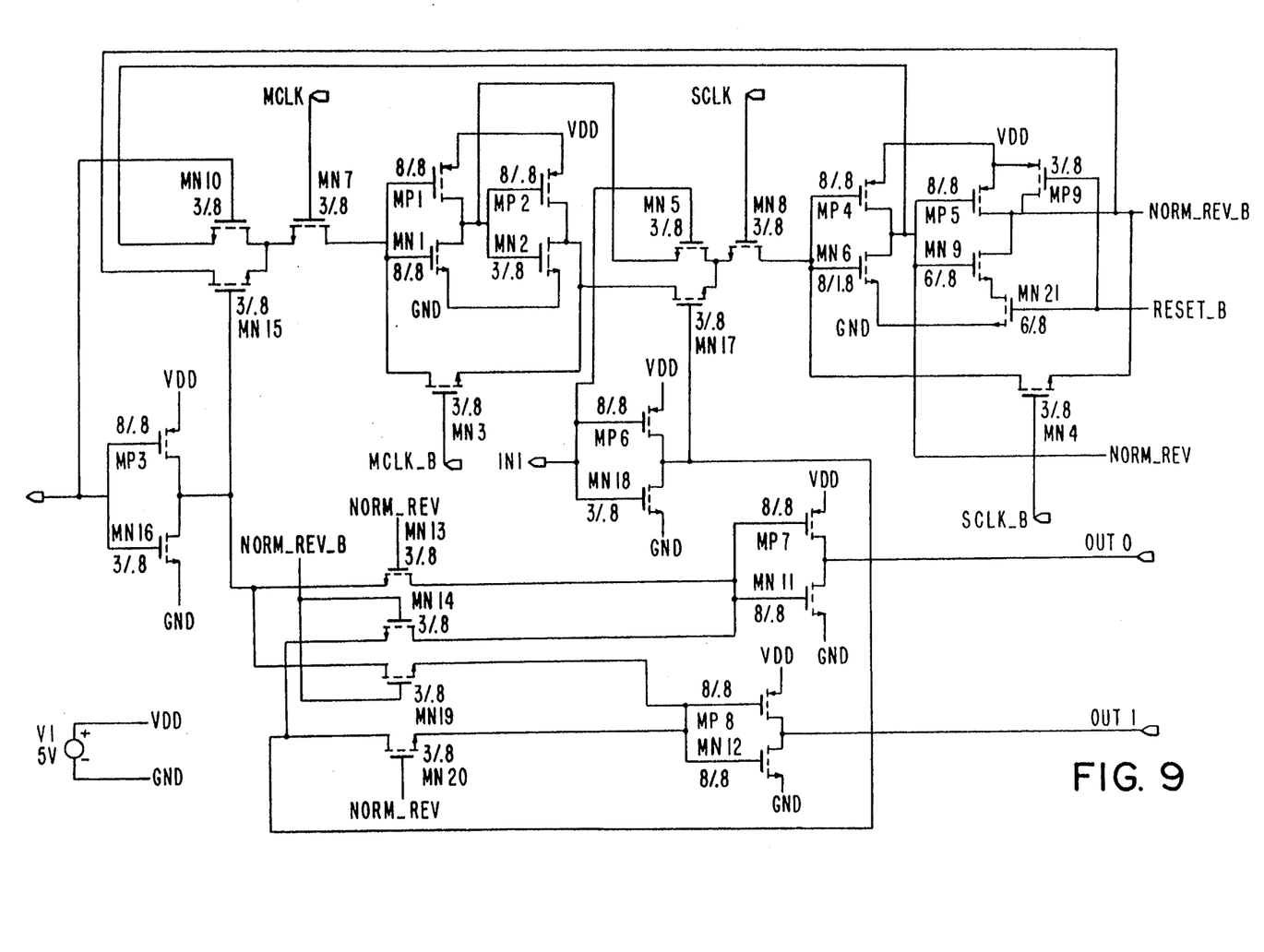
FIG. 9 is a circuit diagram showing an implementation of logic circuitry for a data-directed swapper cell.

A transistor level implementation of the logic circuitry 30 is shown in FIG. 9. In this circuitry, the first XOR gate function has been shifted to a position between the master and slave section of the D-flip/flop. The XOR function is provided by selecting either the inverted or the non-inverted output from the master flip/flop section and applying it to the slave section.

In the embodiment described above, the integrated difference of past output signals can take only the values of 0 and 1. This is not a necessary limitation, and the difference signal can, to provide additional flexibility, assume more than two states. For example, the system may be arranged such that the difference signal can assume any of three states, such as "1", "0" and "−1". In practical terms, and referring to FIG. 6, this would mean that the count in the upper integrator 32 can be (1) one count greater than that of the lower integrator 34, (2) equal to that of the lower integrator, or (3) one count behind the lower integrator. It is often desirable to insure that no "patterns" occur in the data at the scrambler output, which might cause discrete frequencies at each scrambler output bit. By allowing 3 possible values of integrated difference (−1, 0, +1), it is possible under certain conditions to randomly select between swap and no-swap. For example, when the difference is 0 and the inputs are 01 or 10, a random selection may be made. This random selection helps to prevent pattern noise. A logical truth table showing how such an arrangement would operate is set forth below:

| 3-State Truth Table | | | | | |
|---|---|---|---|---|---|
| INA | INB | RANDOM | STATE | SWAP (swap = 1) | NEW STATE |
| 0 | 0 | X | S0 | X | S0 |
| 0 | 0 | X | S1 | X | S1 |
| 0 | 0 | X | S2 | X | S2 |
| 0 | 1 | X | S0 | 1 | S1 |
| 0 | 1 | 0 | S1 | 0 | S0 |
| 0 | 1 | X | S2 | 0 | S1 |
| 0 | 1 | 1 | S1 | 1 | S2 |
| 1 | 0 | X | S0 | 0 | S1 |
| 1 | 0 | 0 | S1 | 0 | S2 |
| 1 | 0 | X | S2 | 1 | S1 |
| 1 | 0 | 1 | S1 | 1 | S0 |
| 1 | 1 | X | S0 | X | S0 |
| 1 | 1 | X | S1 | X | S1 |
| 1 | 1 | X | S2 | X | S2 |

In this truth table, INA and INB are the two swapper inputs, and "RANDOM" is the output of a random number generator that puts out "0" or "1" on every clock cycle. "X" indicates that the output of the random number generator is not used in the logic operation. "STATE" refers to the stored value of COUNT A−COUNT B, where S0 means COUNT B is ahead of COUNT A by 1, S1 means COUNT A equals COUNT B, and S2 means COUNT A is ahead of COUNT B by 1. "SWAP" refers to the swapper control signal, with "1" meaning swap and "0" meaning no swap. "NEW STATE" gives the next value of the "STATE" variable described above. The only time "RANDOM" is used is when the state is "S1" (COUNT A=COUNT B) and the inputs are different. Under those conditions, the choice of "swap/no swap" may be random, i.e., either integrator may be pushed ahead by one count.

As in the case of the 2-state truth table described previously, the hardware for carrying out the 3-state algorithm need not include physical integrating counters. The development of hardware suitable for this algorithm can be derived from the 3-state truth table by means of logic synthesizing computer programs known in the art.

Scrambling provides a way to gain the low out-of-band noise benefits of multi-bit designs while still retaining the excellent distortion characteristics of 1-bit designs. The scrambling algorithm described herein allows for a relaxation of analog matching requirements by as much as 30 dB compared to a random-scrambler approach. This allows very high resolution noise-shaped DACs to be implemented in modest cost CMOS processes.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. For use in apparatus for converting digital signals to analog signals, wherein a multi-bit digital signal is transformed to a thermometer code which passes through a scrambler to a D/A converter to produce an analog output signal;
   an improved scrambler comprising:
   input means and output means;
   a plurality of switchable scrambler devices configured as swapper cells interconnected to provide a number of mutually-exclusive selectable signal paths from said input means to said output means;
   each of said swapper cells including:
   two input terminals to receive respective signal bits and two output terminals to produce corresponding output bits;
   means within each swapper cell for controllably connecting the two input terminals to the two output terminals either directly or reversely;
   select terminal means for receiving an activating signal designating whether the swapper cell is to effect said direct connection or said reverse connection;
   logic means for producing said activating signal;
   said logic means including means for storing the integrated difference of past swapper output signals;
   said logic means further including means for computing the new value of the activating signal based on the current two input values to said swapper cell and said stored integrated difference signal and for updating the value of the stored difference signal.

2. Apparatus as claimed in claim 1, wherein said means for updating the value of the stored difference signal comprises means responsive to the present two input signals and the new value of the activating signal.

3. Apparatus as claimed in claim 1, wherein said swapper cells are arranged in a plurality of equal-numbered sets;
   the input terminals of first set receiving the individual bits of said thermometer code; and
   the input terminals of each succeeding set receiving the output signals of the preceding set.

4. Apparatus as claimed in claim 1, wherein said logic means comprises a clocked flip-flop;
   a first XOR device having one input driven by the output of said flip-flop;
   a second XOR device having one input driven by the output of said first XOR device;
   means connecting the output of said second XOR device to the input of said flip-flop; and
   means connecting the two swapper cell input signals to the other inputs of said first and second XOR devices respectively;
   the output of said first XOR device being connected to said swapper cell as said activating signal.

5. In a digital-to-analog conversion system wherein a digital thermometer code signal is passed through scrambler apparatus of the type comprising means definable as a plurality of swapper cells each having two inputs and two outputs and including means operable by a control signal for establishing either a direct connection between each input and a corresponding output or a reverse connection between said inputs and outputs, said plurality of swapper cells being interconnected to provide a number of mutually-exclusive signal paths selectable in accordance with the states of the control signals for the individual swapper cells;

the method of developing the control signal for each swapper cell which comprises:

storing a signal representing the integrated difference of past output signals of the swapper cell; and operating logically on the state of the two input signals for the swapper cell and said integrated difference to produce said control signal for the swapper cell.

6. The method of claim 5, wherein the logical operation includes a comparison of the two input signals to determine whether a change should be made to the integrated difference signal.

7. The method of claim 6, wherein the logical operation changes said integrated difference signal if the two inputs are different.

8. The method of claim 5, wherein said integrated difference of past swapper cell outputs establishes whether the difference between the two outputs is one or the other of two possible states.

9. The method of claim 5, wherein said integrated difference of past swapper cell outputs establishes whether the difference between the two cell outputs is one of three possible states.

10. In a digital-to-analog conversion system wherein a digital thermometer code signal is passed through scrambler apparatus of the type comprising means definable as a plurality of swapper cells each having two inputs and two outputs and including means operable by a control signal for establishing either a direct connection between each input and a corresponding output or a reverse connection between said inputs and outputs, said plurality of swapper cells being interconnected to provide a number of mutually-exclusive signal paths selectable in accordance with the states of the control signals for the individual swapper cells;

the method of developing the control signal for each swapper cell which comprises:

operating logically on the states of the two swapper input signals for the respective swapper cell;

including in said logical operation the states of the output signals of the swapper; and producing said control signal from the results of said logical operation.

11. The method of claim 10, wherein said logical operation carries out the following truth table:

| INA | INB | CNTA−CNTB | SWAP CTRL | NEW CNTA−CNTB |
|---|---|---|---|---|
| 0 | 0 | 0 | X | 0 |
| 0 | 0 | 1 | X | 1 |
| 0 | 1 | 0 | SWAP | 1 |
| 0 | 1 | 1 | NO SWAP | 0 |
| 1 | 0 | 0 | NO SWAP | 1 |
| 1 | 0 | 1 | SWAP | 0 |
| 1 | 1 | 0 | X | 0 |
| 1 | 1 | 1 | X | 1 |

In this truth table, the first two columns are the swapper cell inputs; the third column is the integrated difference of past swapper outputs; the fourth column is the state of the swap control signal; the fifth column is the new state of the difference signal.

12. The method of claim 10, wherein said logical operation carries out the following truth table:

| INA | INB | RANDOM | STATE | SWAP (swap = 1) | NEW STATE |
|---|---|---|---|---|---|
| 0 | 0 | X | S0 | X | S0 |
| 0 | 0 | X | S1 | X | S1 |
| 0 | 0 | X | S2 | X | S2 |
| 0 | 1 | X | S0 | 1 | S1 |
| 0 | 1 | 0 | S1 | 0 | S0 |
| 0 | 1 | X | S2 | 0 | S1 |
| 0 | 1 | 1 | S1 | 1 | S2 |
| 1 | 0 | X | S0 | 0 | S1 |
| 1 | 0 | 0 | S1 | 0 | S2 |
| 1 | 0 | X | S2 | 1 | S1 |
| 1 | 0 | 1 | S1 | 1 | S0 |
| 1 | 1 | X | S0 | X | S0 |
| 1 | 1 | X | S1 | X | S1 |
| 1 | 1 | X | S2 | X | S2 |

INA and INB are the two swapper inputs, and "RANDOM" is the output of a random number generator that puts out "0" or "1" on every clock cycle. "X" indicates that the output of the random number generator is not used in the logic operation. "STATE" refers to the stored value of COUNT A−COUNT B, where S0 means COUNT B is ahead of COUNT A by 1, S1 means COUNT A equals COUNT B, and S2 means COUNT A is ahead of COUNT B by 1. "SWAP" refers to the swapper control signal, with "1" meaning swap and "0" meaning no swap. "NEW STATE" gives the next value of the "STATE" variable described above.

* * * * *